(12) United States Patent  (10) Patent No.: US 6,449,515 B2
Imoto  (45) Date of Patent: Sep. 10, 2002

(54) CONTROLLER

(75) Inventor: Masaru Imoto, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/775,563

(22) Filed: Feb. 5, 2001

Related U.S. Application Data

(63) Continuation of application No. 08/979,697, filed on Nov. 26, 1997, now Pat. No. 6,307,153.

(30) Foreign Application Priority Data

Nov. 29, 1996 (JP) ............................................... 8-320204

(51) Int. Cl.⁷ ............................................... G05B 11/01
(52) U.S. Cl. .......................................... 700/23; 700/11
(58) Field of Search ............................... 700/11–27, 86, 700/89; 710/1; 712/37; 711/115

(56) References Cited

U.S. PATENT DOCUMENTS

| | | | |
|---|---|---|---|
| 4,200,914 A | 4/1980 | Kinter .................... | 364/DIG. 2 |
| 4,558,914 A | 12/1985 | Prager et al. ............... | 361/686 |
| 4,923,681 A | 5/1990 | Cox et al. .................. | 422/116 |
| 5,099,391 A | 3/1992 | Maggelet et al. ........... | 361/686 |
| 5,321,603 A | 6/1994 | Schwenke .................. | 364/146 |
| 5,369,740 A | 11/1994 | Naylor .................. | 364/DIG. 2 |
| 5,485,590 A * | 1/1996 | Hyatt et al. .................. | 711/115 |
| 5,541,810 A | 7/1996 | Donhauser et al. ......... | 361/686 |
| 5,774,355 A * | 6/1998 | Mizuno et al. ................ | 700/23 |
| 5,799,205 A | 8/1998 | Niemann et al. ........... | 395/840 |

FOREIGN PATENT DOCUMENTS

| | | |
|---|---|---|
| EP | 0 499 675 | 8/1992 |
| EP | 0 597 561 | 5/1994 |
| EP | 0 612 205 | 8/1994 |
| JP | 63-132362 | 6/1988 |
| JP | 63-282535 | 11/1988 |
| JP | 2-8906 | 1/1990 |
| JP | 2-73204 | 6/1990 |
| JP | 3-97708 | 10/1991 |
| JP | 4-36803 | 2/1992 |
| JP | 4-52905 | 2/1992 |
| JP | 4-56383 | 5/1992 |
| JP | 6-19516 | 1/1994 |

* cited by examiner

Primary Examiner—Leo Picard
Assistant Examiner—Steven R. Garland
(74) Attorney, Agent, or Firm—Foley & Lardner

(57) ABSTRACT

A programmable controller includes a terminal which receives input data from an input unit and outputs output data to be applied to an output unit. The programmable controller also includes a communication unit which executes a serial communication with the terminal to send the output data to the output unit and to receive the input data from the input unit. A control unit repeatedly executes an input process for reading the input data received by the communication unit, an output process for sending the output data to be transmitted by the communication unit, a program execution process for executing a user program and an other process. The program execution process is executed between the input process and a subsequent output process, and the other process is executed between the output process and a subsequent input process.

3 Claims, 14 Drawing Sheets

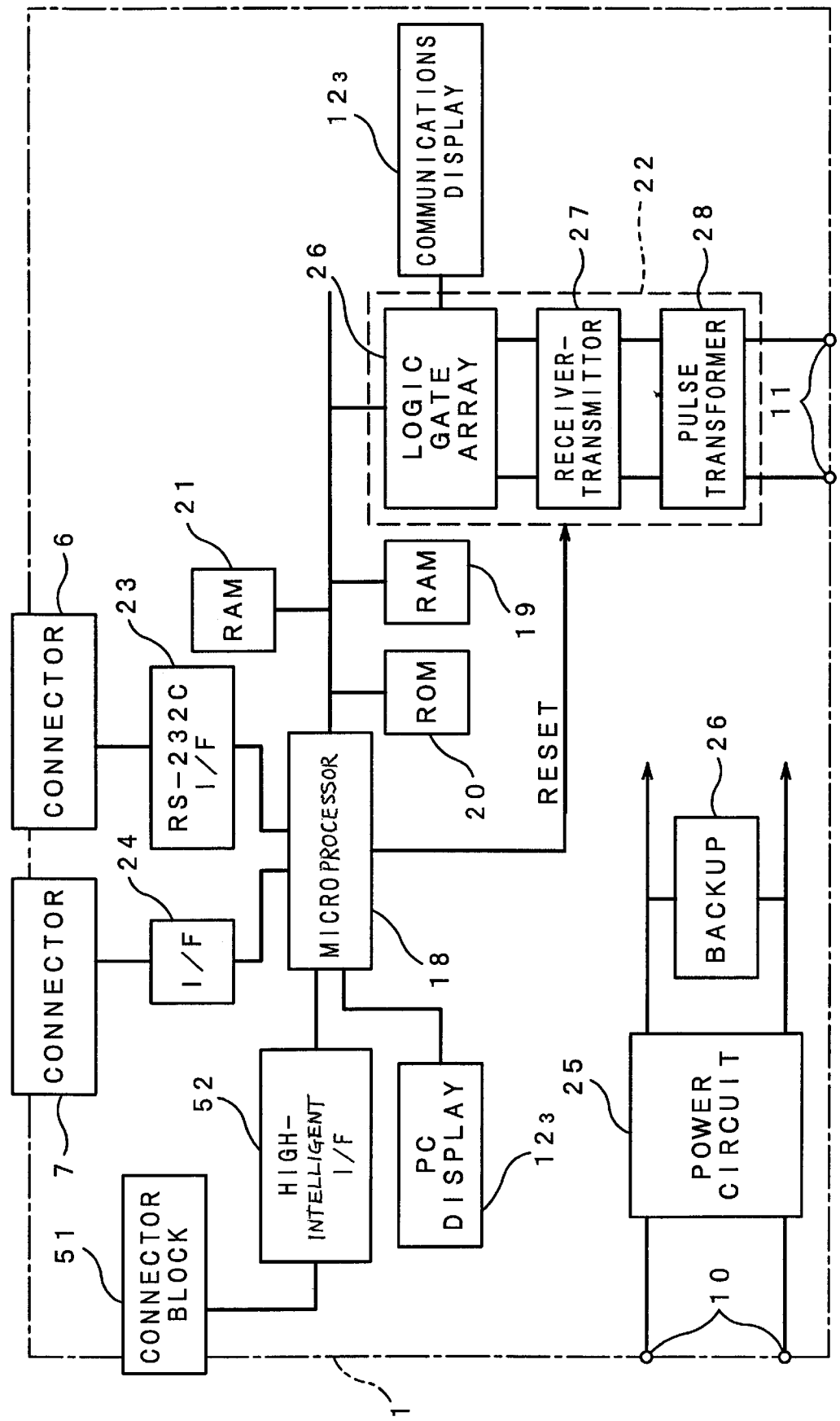

CONTROLLER

This is a continuation of Ser. No. 08/979,697 filed Nov. 26, 1997 now U.S. Pat. No. 6,307,153.

BACKGROUND OF THE INVENTION

1. Field of the Invention

This invention relates to a controller, and more particularly to an improved device such as a programmable controller suitable for a sequence control.

2. Discussion of the Related Art

There is well known a controller or a sequence control system employing a programmable controller, in which a communication unit as a master station is mounted to a base unit of the programmable controller, terminals as a plurality of slave stations are connected to the communication unit, and each of the terminals is connected by an input unit such as a limit switch or various sensor or an output unit such as a air valve or an actuator. In such a well known sequence control system, ON-OFF input data produced from the input unit such as the limit switch or various sensor is transferred to the programmable controller through the terminals, the programmable controller receives the input data to operate the received data in accordance with a program set beforehand and generate ON-OFF output data to be applied to the output unit such as the air valve or actuator through the terminals, and a machine tool is thus controlled.

The conventional programmable controller is provided with a connector connection unit to be connected with a programming tool, RS232 association components device or the like. When a cable connector of the programming tool is mounted on the connector connection unit, the cable connector is kept to externally project from a main housing body of the programmable controller. That is, the cable connector mounted on the main housing body of about rectangular parallelepiped is kept to eternally project bringing a dead space by the wiring. In the sequence control system, the base unit of the programmable controller is mounted by the communication unit employing a communication CPU whereby an input-and-output response time is delayed because data transmission is delayed between the CPU of the base unit and the communication CPU of the communication unit. The base unit of the programmable controller and the communication unit are separated units, so that an interface circuit or the like is necessary to be disposed between the both units and each unit has to be provided with CPU, resulting into a bulky configuration and expensive controller.

SUMMARY OF THE INVENTION

It is, therefore, a primary object of this invention to provide an improved controller in which a dead space for wiring is decreased, an input-and-output response time is shortened, its configuration is miniaturized, and its manufacturing cost is reduced.

According to a first aspect of this invention, there is provided a controller including a connector connection unit for connection with a cable connector, a housing having difference in level and a display disposed on a higher level section of the housing, one board disposed in parallel with a side wall of the housing, another board disposed to cross the one board, the one board being positioned on the higher level section of the housing and the connector unit on the another board being positioned on a lower level section of the housing. The difference in level corresponds to height of a connector connected with the connector connection unit. The another board is provided with a power supply circuit and the one board is provided with a control circuit.

Since the connector connection unit is placed on the lower level section of the main body housing, the controller may easily ensure wiring space by avoiding such conventional inconvenience that a cable connector projects from the main body housing of the controller. The one board is positioned in parallel with the side wall of the housing and the another board is placed to cross the one board so that they may be effectively accommodated by the housing having the lower and higher sections, resulting into miniaturization of the controller. The control circuit mounted on the one board is separated from the another board provided with the power supply circuit, so that the control circuit is free from heat or noise from the power supply circuit and the freedom of mounting design of the boards is improved.

According to a second aspect of this invention, the controller receives input data from an input unit through a terminal and produces output data to be applied to an output unit through the terminal, and further includes a communication means for executing a serial communication with the terminal to receive and send the input and output data. The controller including the communication means for receiving and transmitting the input and output data about the terminal by serial communication does not need any communication unit which is conventionally necessary as a master station, so that data transmission speed of this controller is higher than that of the conventional controller employing the communication unit existing in the communication.

According to a modification of the second aspect of this invention, there is provided a programmable controller further including a control means for repeatedly executing an input process for reading input data received by the communication means, an output process for sending output data to be transmitted to the communication means, a program execution process for executing a user program, and other process, the program execution process being executed between the input process and its subsequent output process, and the other process being executed between the output process and its subsequent input process. The communication means starts in response to the output operation. One communication cycle of the communication means starts by transmission of the output data and ends by receipt of the input data following the transmission.

BRIEF DESCRIPTION OF THE DRAWINGS

Other objectives and advantages of this invention will be more readily apparent from the following detailed description provided in conjunction with the following figures, of which:

FIG. 15 is a schematic block diagram of the programmable controller of FIG. 12.

DETAILED DESCRIPTION OF THE INVENTION

Figure 1:
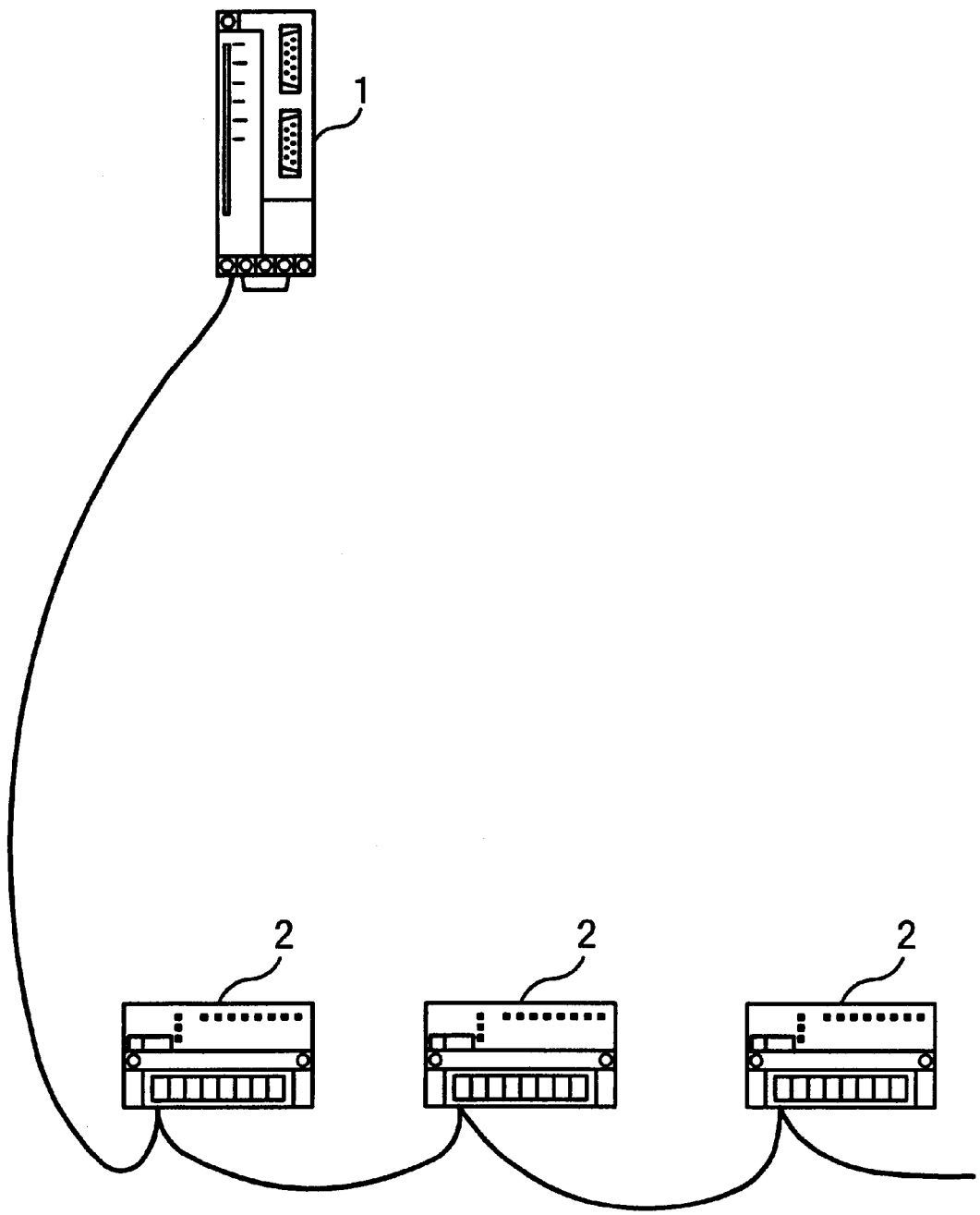
FIG. 1 shows a construction of a control system provided with a programmable controller as a first embodiment of this invention.

Referring, now, to FIG. 1 there is shown a construction of a control system provided with a programmable controller 1 as a first embodiment of this invention. The control system includes the programmable controller 1 and a plurality of terminals 2 as slave stations which are bus connected with the programmable controller 1 through a cable. Each terminal 2 is connected with an input unit such as a proximity switch, a limit switch or the like, or an output unit such as a relay, an actuator or the like, which are not shown in any drawings. This control system transmits ON/OFF input data from the input unit to the programmable controller 1 through terminal 2, and the programmable controller 1 receives the input data to operate the input data according to a program set beforehand and produces ON/OFF output data to the output unit through terminal 2 to control a machine tool. This system is not necessary to employ any communication unit conventionally required as a master station, while the programmable controller 1 has a function as a master station as described later.

Figure 2:
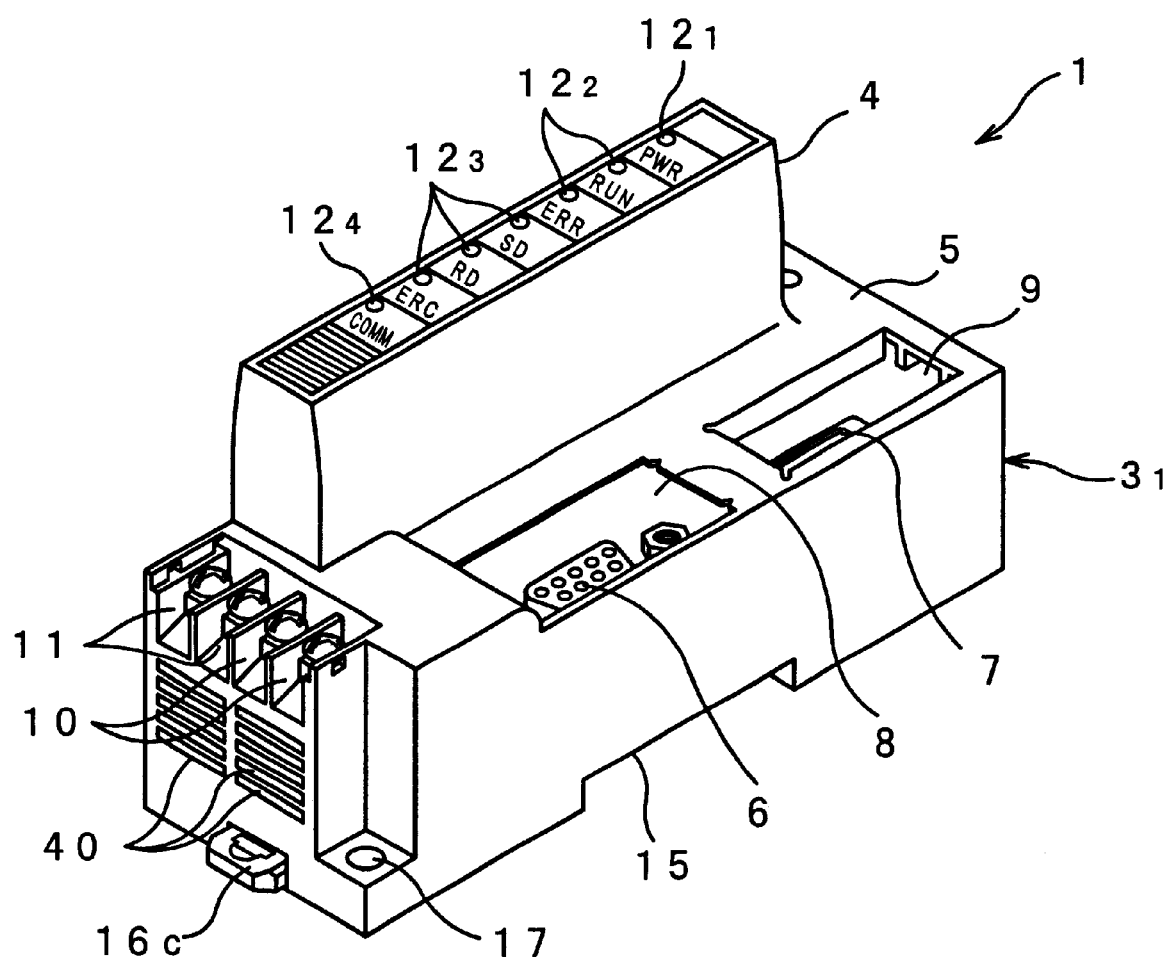
FIG. 2 is a perspective view of the programmable controller block diagram of FIG. 1.
Figure 3:
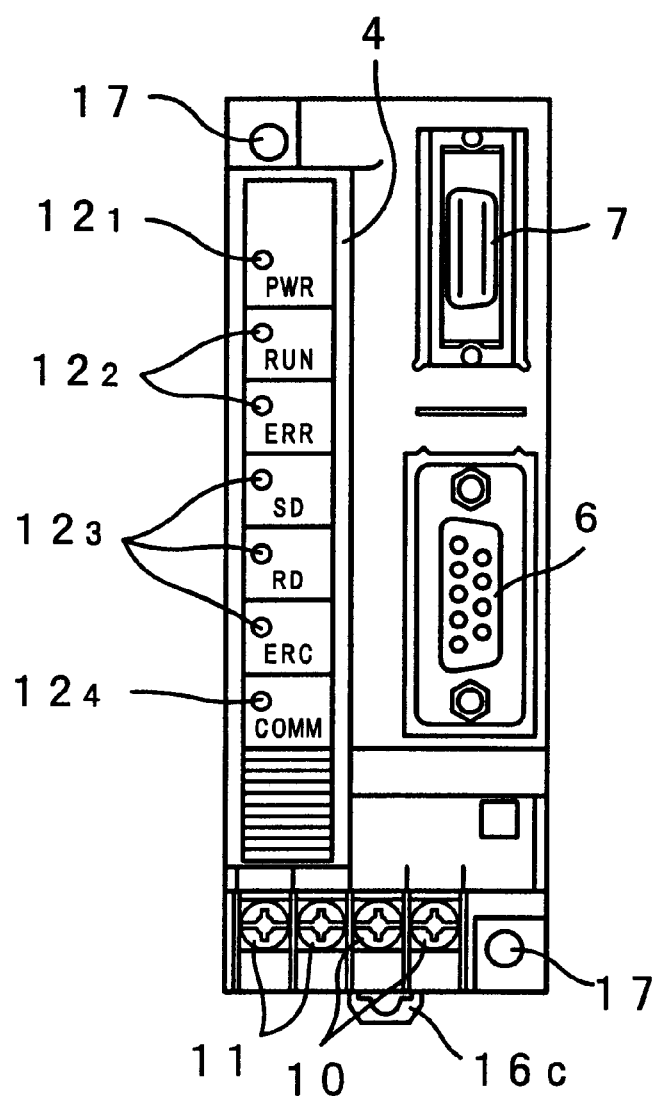
FIG. 3 is a front view of the programmable controller of FIG. 2.
Figure 4:
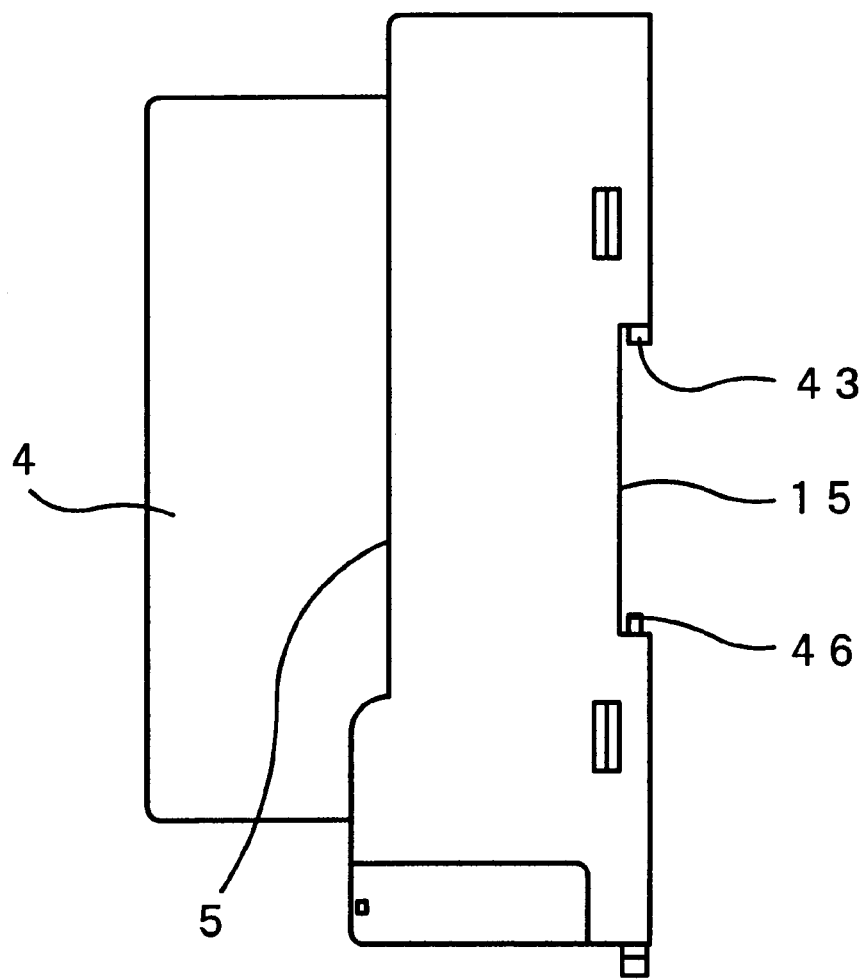
FIG. 4 is a side view of the controller of FIG. 3.
Figure 5:
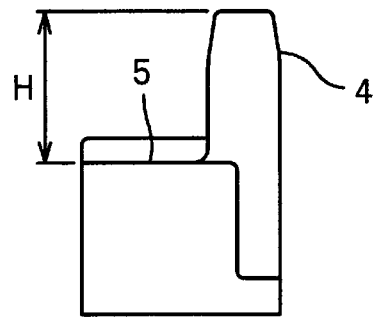
FIG. 5 is a plan view of the controller of FIG. 3.

FIG. 2 is a perspective view of the programmable controller 1 of FIG. 1, FIG. 3 is a front view of the programmable controller of FIG. 2, FIG. 4 is a side view of the controller 1 of FIG. 3, and FIG. 5 is a plan view of the controller of FIG. 3.

The programmable controller 1 of this embodiment includes a main body housing having a front housing $3_1$ and a rear housing $3_2$ on a bottom of the controller. A projection 4 is disposed at one side of a front wall of the front housing $3_1$, extending along a longitudinal direction of the housing (vertical direction in FIG. 3), and a flat section 5 lower than the projection 4 is disposed on other side of the front wall. In the flat section 5 there are disposed openings 8 and 9 respectively corresponding to a RS-232C connector connection unit 6 to connect RS-232C corresponding unit and a peripheral connector connection unit 7 to connect a peripheral component, so that the connector connection units 6 and 7 face outwardly of the housing $3_1$ through the openings 8 and 9. The opening 9 for the peripheral connector connection unit 7 may be closed by a plastic cover (not shown in drawings) when the connector connection unit 7 is not used.

On a lower portion of the front wall of the housing there are disposed power input terminals 10, and terminal connection terminals 11 in parallel.

On an upper wall of the projection 4, there are disposed a power display (PWR) $12_1$ for displaying and monitoring input power supply, a status display $12_2$ for displaying an operation status of the programmable controller 1, viz., an operation (RUN) and an error (ERR), a communication status display $12_3$ for displaying data transmission (SD), data receipt (RD) and communication error (ERC), and a peripheral RS-232C display $12_4$ for displaying communication (COMM) with a peripheral unit or RS-232C association component.

A difference between the upper wall of the projection 4, viz., an upper surface of the displays $12_1$ to $12_4$, and the flat section 5 provided with openings 8 and 9 of the RS-232C connector connection unit 6 and the peripheral connector connection unit 7, that is, a height H of the projection 4 shown in FIG. 5 is designed to be almost equal to a height of a hood portion of a cable connector plugged in the connector connection units 6 and 7. Accordingly, when cable connectors of a RS-232C association component and a peripheral component are mounted on the connector connection unit 6 and 7, the height of the hoods of the cable connectors does not exceed the projection 4. In a conventional programmable controller employing no difference in level in the housing, a hood of a cable connector projects from a main housing of the programmable controller when the connector is connected into a connector connection unit of the programmable controller, resulting in production of a dead space. In this embodiment, however, the hood of the connector connected with the connector connection units 6 and 7 is positioned to have same height as that of the projection 4, so that such a dead space is decreased and a space for wiring is ensured.

Figure 6:
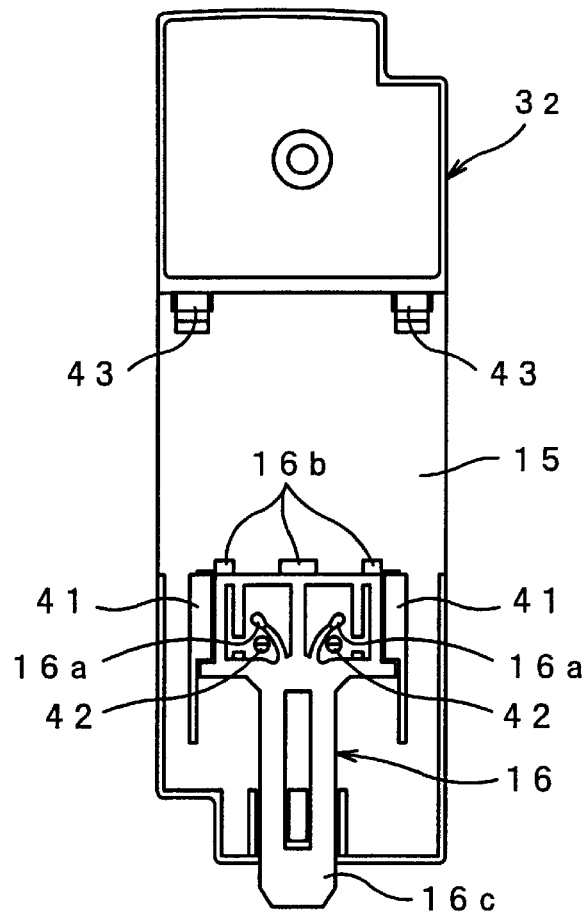
FIG. 6 is a rear view of the controller of FIG. 2.

On the rear housing $3_2$ of the programmable controller there is disposed a rail groove 15 along a width direction to engage the programmable controller 1 with a support rail (not shown in drawings), as shown in FIGS. 4 and 6.

On one side edge (upper side edge) in the horizontal rail groove 15, there are disposed a pair of engagement pieces 43 projecting toward the rail groove 15 on both sides, whereby an upper engagement portion of the support rail is engaged between the engagement pieces and a bottom of the rail groove. On other side edge (lower side edge) in the horizontal rail groove 15 there is provided a movable plastic engagement lead 16 including three engagement portions 16b to be engaged with a lower engagement edge of the support rail, which is positioned crossing the rail groove 15 for a forward-and-backward movement. A lower engagement edge of the support rail is inserted between the three engagement portions 16b of the movable engagement lead 16 and the bottom of the rail groove.

The movable engagement lead 16 is mounted along a pair of guide grooves 41 formed on the rear housing $3_2$ for a slidable movement. A free end of arm 16a supported at other end thereof within an internal portion of the movable engagement lead 16 formed as a single unit comes into contact with a projection 42 projecting from the bottom housing so that an elastic force of the arm 16a biases the movable engagement lead 16 toward the rail groove 15. A lower end of the lead 16 serves as an operation piece 16c for disengagement which projects by several millimeters from the housing when the lead 16 is biassed to the rail groove 15 and includes an operation hole in a front portion of the piece 16c to be inserted by a screw driver.

As shown in FIGS. 2 and 3, an a pair of corners opposing each other across a slant direction in a rear wall of the front housing $3_1$, there are disposed a pair of mounting holes 17 so as to mount the programmable controller also by screws. A group of slits 40 are disposed in a proper portion of the front housing $3_1$ to externally exhaust the heat generated within the housing.

Figure 7:
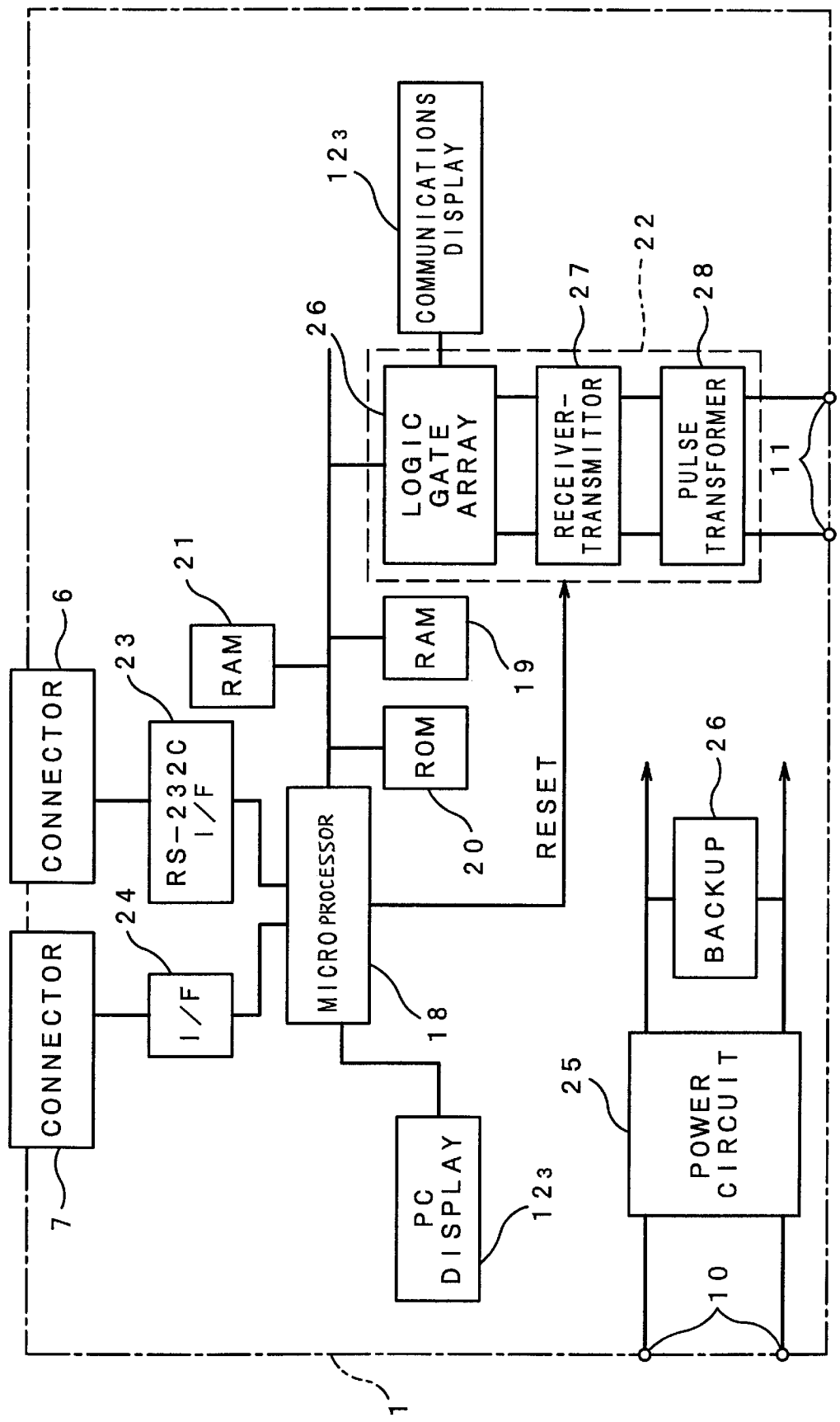
FIG. 7 is a schematic block diagram of the programmable controller of FIG. 2.

FIG. 7 is a schematic block diagram of the programmable controller 1. The programmable controller 1 of this embodiment has a construction for direct serial communication with terminals 2 without connection by any communication unit as a master station as described hereinafter.

The programmable controller 1 includes a microprocessor 18 as a control means for controlling respective components and executing an operation described later, RAM 19 and ROM 20 as a program memory, RAM 21 as a data memory, a communication means 22 for executing serial communication with the terminals 2, a RS-232C interface 23, a peripheral unit interface 24, a power circuit 25 dropping to a d.c. voltage 24 volts for power supply, and a backup circuit 26 for the power supply.

The communication means 22 includes a logic gate array 26, a receiver-and-transmitter 27, a pulse transformer 28 for improving noise resistance characteristics. The logic gate array 26 converts parallel output data produced from the microprocessor 18 into serial data, converts the serial data into a communication format to be transmitted to the terminals 2 through the receiver-and-transmitter 27 and the pulse transformer 28 in a serial transmission format, receives data from the terminals 2 through the pulse transformer 28 and the receiver-and-transmitter 27 to be converted into parallel input data to be applied to the microprocessor 18. The logic gate array 26 also controls the communication status display 123 for displaying a communication status between the terminals 2 and the programmable controller.

The communication means 22 initiates one communication cycle in response to an output refresh process in a later-described cyclic process. The one communication cycle begins by the transmission of output data to the terminals 2 and finishes by the receipt of input data from the terminals 2.

As an output refresh process is executed and output data from the microprocessor 18 is set to an output register of the logic gate array 26 for start, the communication means 22 converts parallel output data into serial data, converts the serial data into a communication format to be transmitted to the terminals 2 through the receiver-and-transmitter 27 and the pulse transformer 28 in a serial transmission format, subsequently receives data from the terminals 2 through the pulse transformer 28 and the receiver-and-transmitter 27 to be set to an input register of the logic gate array 26 to notify the microprocessor 18 of the completion of communication. Thus, the microprocessor 18 receives input the received data after execution of an input refresh process described later.

Figure 8:
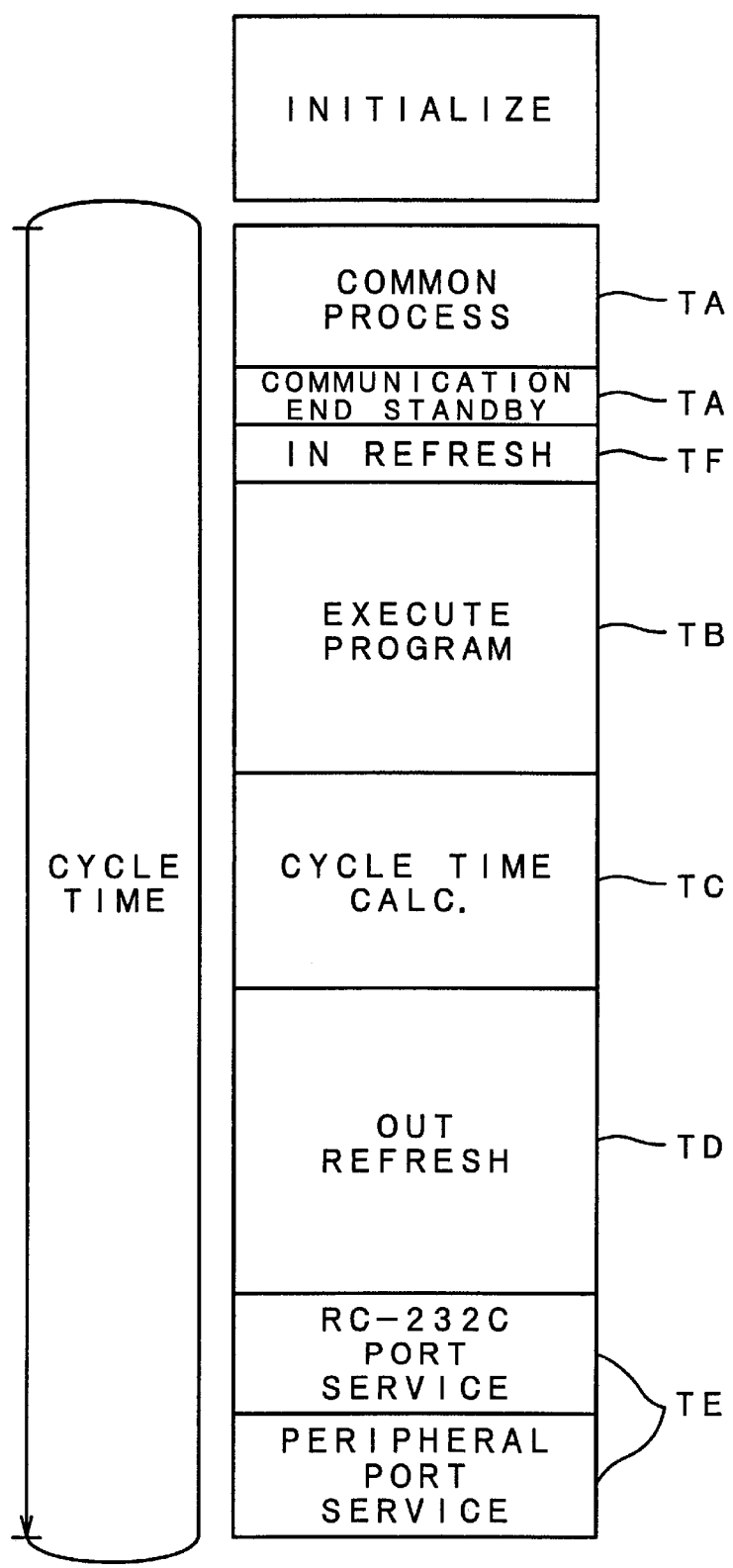
FIG. 8 is an illustration for explaining a cyclic operation by the programmable controller.

FIG. 8 is an illustration for explaining the cyclic operation by the microprocessor 18.

The microprocessor 18 of this embodiment executes an initialization process upon power activation, a common process (TA) such as memory check or the like unless there is any error, a standby process (TG) for waiting completion of one cycle by the communication means 22, an input refresh process (TF) in which input data received from the terminal 2 is taken by the communication means 22, a program execution process (TB) in which a user program is executed based on the latest taken input data, a cycle time computing process (TC), an output refresh process (TD) in which the output data obtained by the program execution process (TB) is written into the output register of the logic gate array 26 of the communication means 22, a peripheral port service process (TE) such as a RS-232C port service and a peripheral port service, and again the common process (TE) to repeat the above-mentioned processes.

In this embodiment, the input refresh process is executed to take the latest input data just before the execution of the program execution process, the output refresh process is executed just after the execution of the program execution process and the cycle time computing process to initiate the transmission of the output data, whereby the input-and-output response is improved.

As described above, the one communication cycle by the communication means 22 begins by the transmission of the output data to the terminals 2 and finishes by the receipt of the input data, so that the peripheral service process and the common process may be performed by effectively using a time from the beginning to the finish of the communication in response to the output refresh process, whereby the input-and-output response is further improved.

Figure 9:
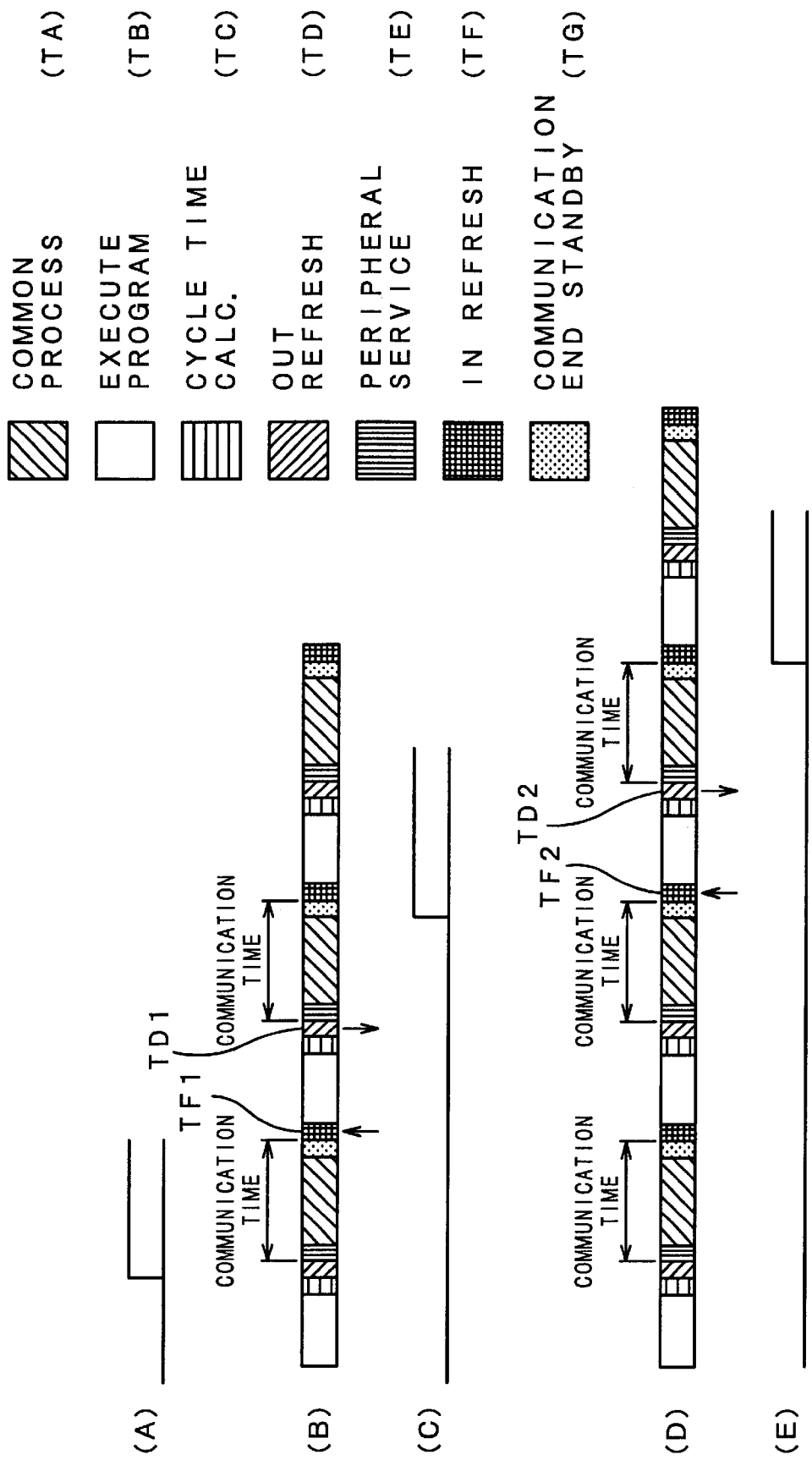
FIG. 9 is a timing chart for explaining an input-and-output response time of the programmable controller.

FIG. 9 is a timing chart for explaining the minimum and maximum input-and-output response time of the programmable controller of this embodiment. FIG. 9 shows at (A) a variation of the input of the terminal 2, at (B) contents processed by the microprocessor 18, at (C) a variation of the output of the terminal 2, at (D) contents processed by the microprocessor 18, and at (E) a variation of the output of the terminal 2.

As shown in FIG. 9 at (A) and (B), when there appears a change of an input before start of the communication time, the change of the input is taken by the input refresh process TF1 after the end of the communication time, the program execution process and the cycle time process are executed in response to the input, the communication is begun to transmit to the terminal 2 in response to the subsequent output refresh process TD1, and the output of the terminal 2 is changed as shown in FIG. 9 at (C).

As shown in FIG. 9 at (A) and (D), when there appears a change of the input after start of the communication time, the change of the input is taken by the input refresh process TF2 after end of the subsequent cycle communication time because it is not in time for the current communication cycle, the program execution process and the cycle time computing process are executed based on the input, the communication is begun to transmit to the terminal 2 in response to the subsequent output refresh process TD2, and the output of the terminal 2 is changed as shown in FIG. 9 at (E).

Though a communication CPU in a conventional communication unit always continues to communicate with the terminals independently of a CPU of a base unit so that transmission of output data have to be waited until end of the former communication cycle, the communication of this embodiment immediately starts in response to the output refresh process to initiate the transmission of the output data and the receipt of the input data. That is, the control of the microprocessor 18 and the communication by the communication means 22 are synchronously executed, so that the communication may be immediately initiated in response to the output refresh process and the input-and-output response time may be shortened. Accordingly, analog data may be processed.

Figure 10:
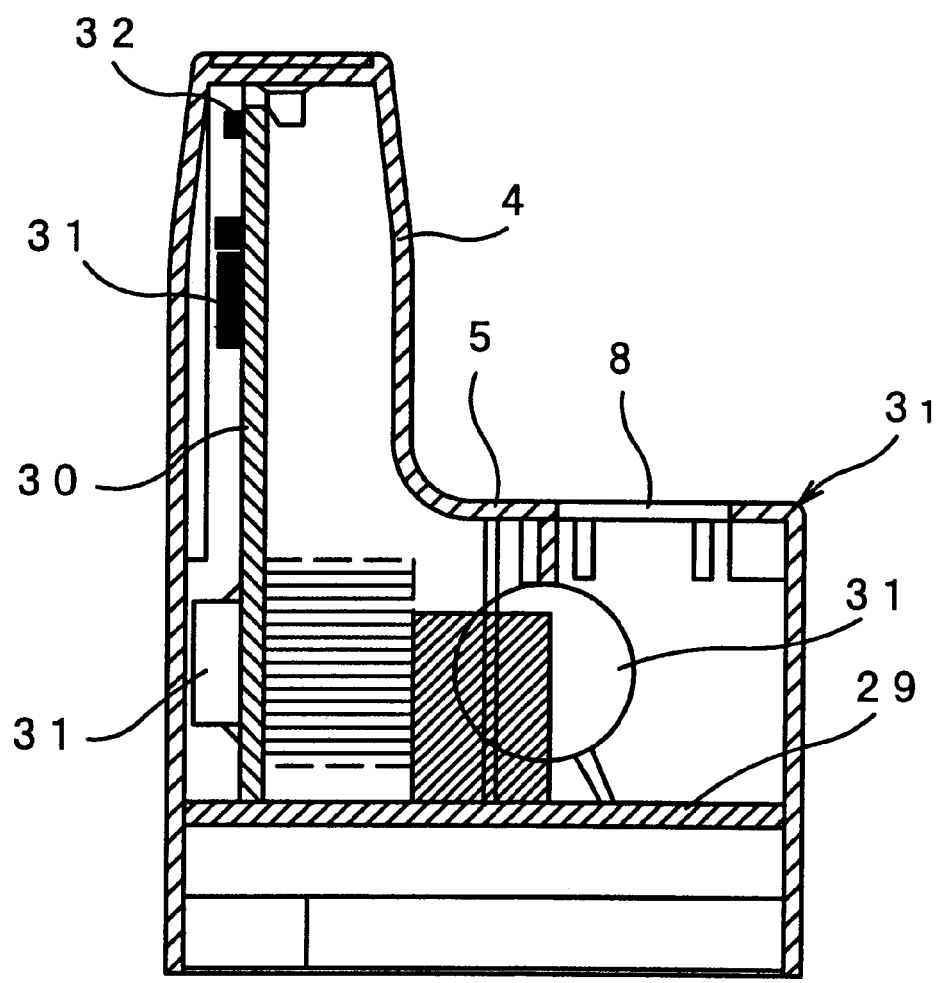
FIG. 10 is a schematic sectional view of programmable controller to explain an internal construction thereof.

FIG. 10 is a schematic sectional view of the programmable controller 1.

Within the main body housing of the programmable controller 1 of this embodiment there are housed a first circuit board 29 placed along the front flat section 5 and a second circuit board 30 standing on one end of the first circuit board 29 and placed along a projection direction of the projection 4.

In this embodiment, the first circuit board 29 is provided with the above-mentioned power supply circuit 25, the respective connector connection units 6 and 7, and the communication terminals 11 of the pulse transformer 28. The second circuit board 30 is provided with the microprocessor 18 providing a control circuit, the logic gate array 26 and other circuits, whereby the heat or noise generated from the first circuit board 29 is reduced about the affection to the microprocessor and the like of the second circuit board 30. Thus, the generator of the noise and heat is separated from the control circuit, whereby the freedom of design for mounting is improved. The transmission of the heat also is reduced by the openings 8 and 9 of the flat section 5 of the front housing $3_1$.

If desired, a separator may be disposed within the main body housing as shown by dotted assumption lines in FIG. 10 so that the transmission of the heat from the heat generator may be further reduced.

The first circuit board 29 is placed horizontally, and the second circuit board 30 stands within the projection 4, whereby the internal space of the main body housing is effectively used resulting into miniaturization of the programmable controller.

On the circuit boards 29 and 30, there are mounted various kinds of electronic components 31 providing the above-mentioned circuits. On the top end of the standing second circuit board 30 there are side view LEDs 32 to illuminate the displays $12_1$ to $12_4$ on the upper wall of the projection 4.

A border of the projection 4 and the flat section 5 is formed in a curved surface, whereby it is easily separated from a metal mold and the mechanical intensity is improved.

Figure 11:
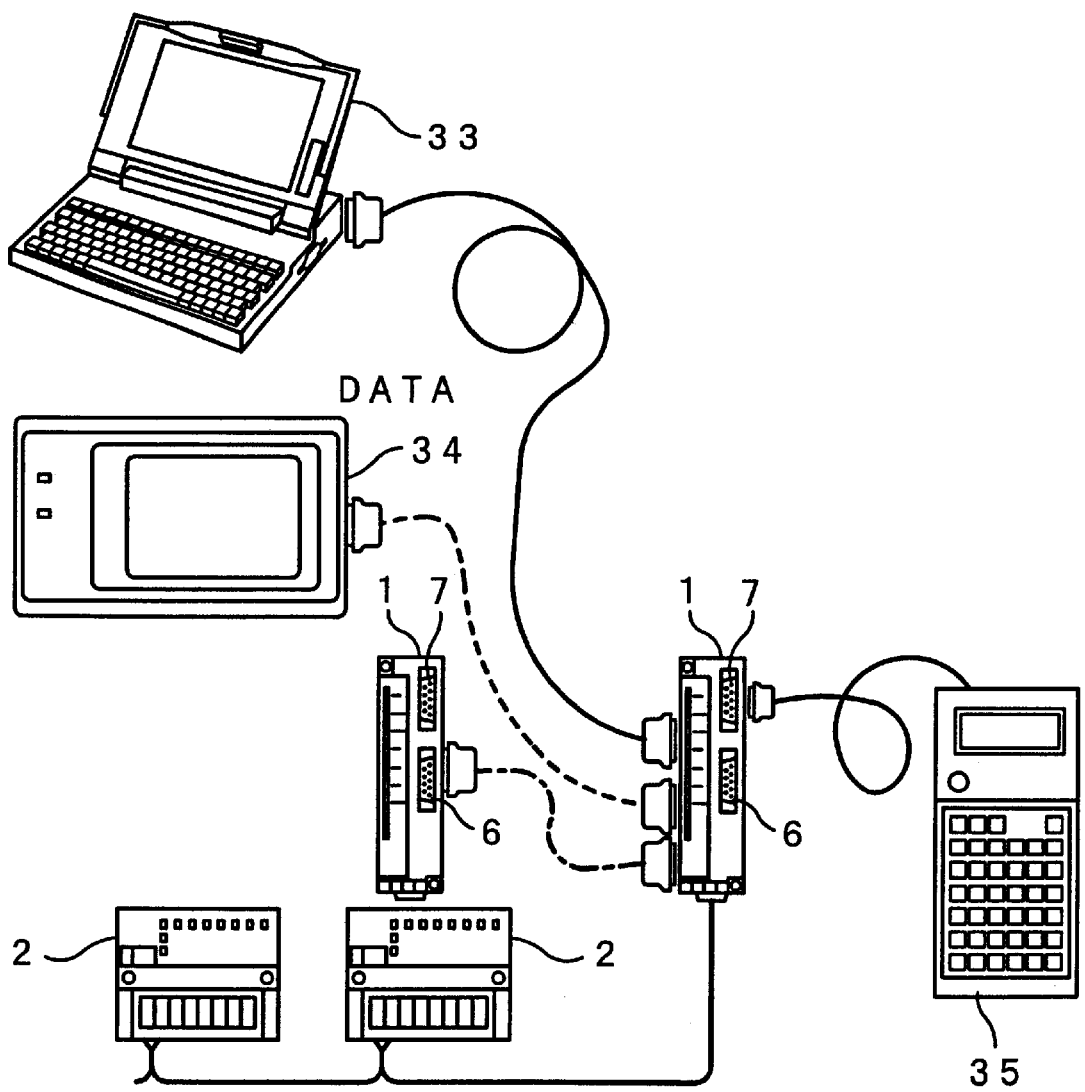
FIG. 11 shows a system employing the programmable controller.

Like a conventional programmable controller, as shown in FIG. 11, the programmable controller of this embodiment maybe connected with a large scale programmable controller (not shown in drawings), a personal computer 33, and a display 34 through a connector connection unit 6 for RS-232C, and may be further connected with peripheral components such as a programming console 35 through the peripheral connector connection unit 7. If desired, both programmable controllers 1 and 1 of this invention may be connected each other through the RS-232C connector connection unit 6 for mutual data transmission.

Figure 12:
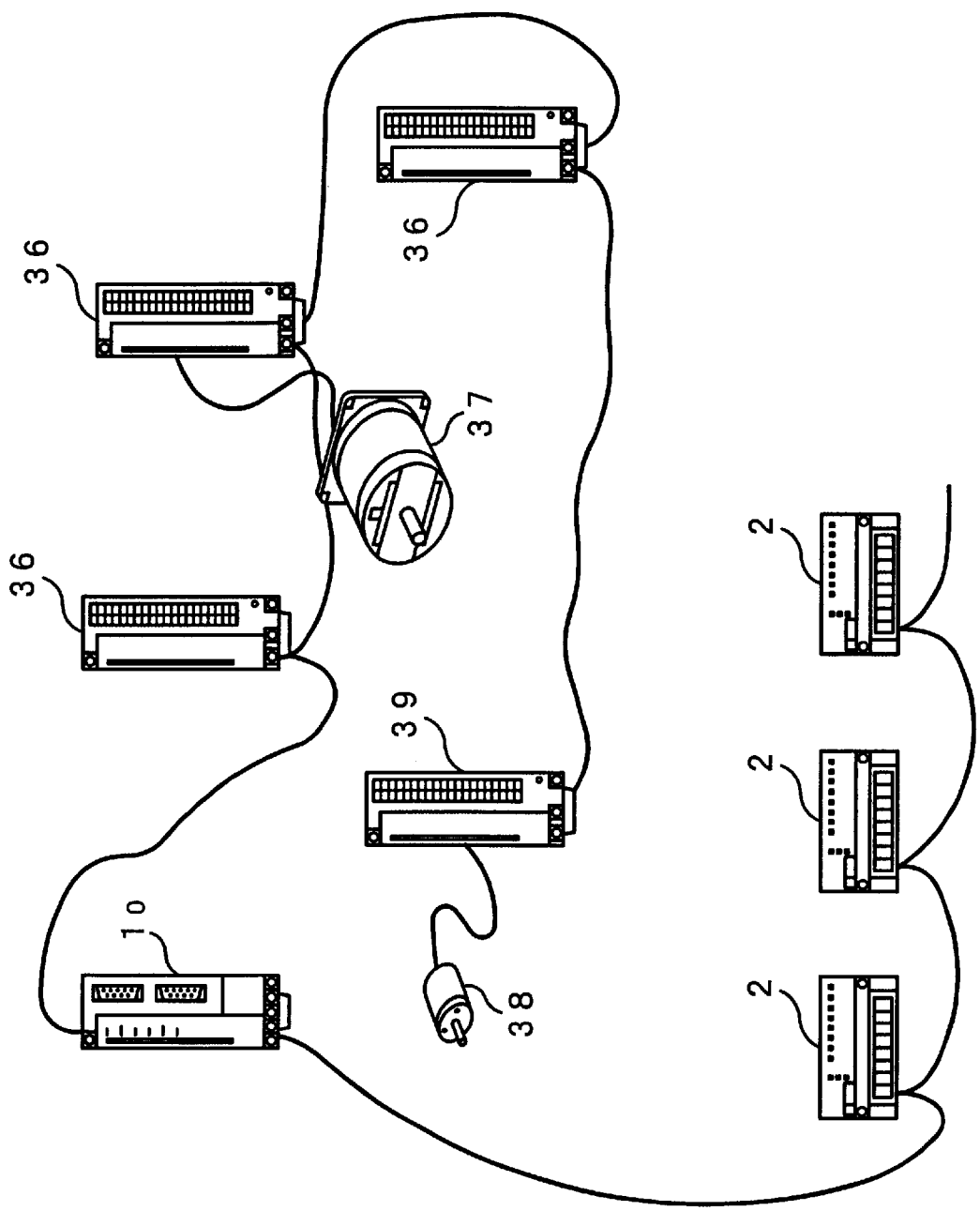
FIG. 12 is a construction of a control system provided with a programmable controller as a second embodiment of this invention.

FIG. 12 is a construction of a control system provided with a programmable controller $1_O$ as a second embodiment of this invention.

Figure 13:
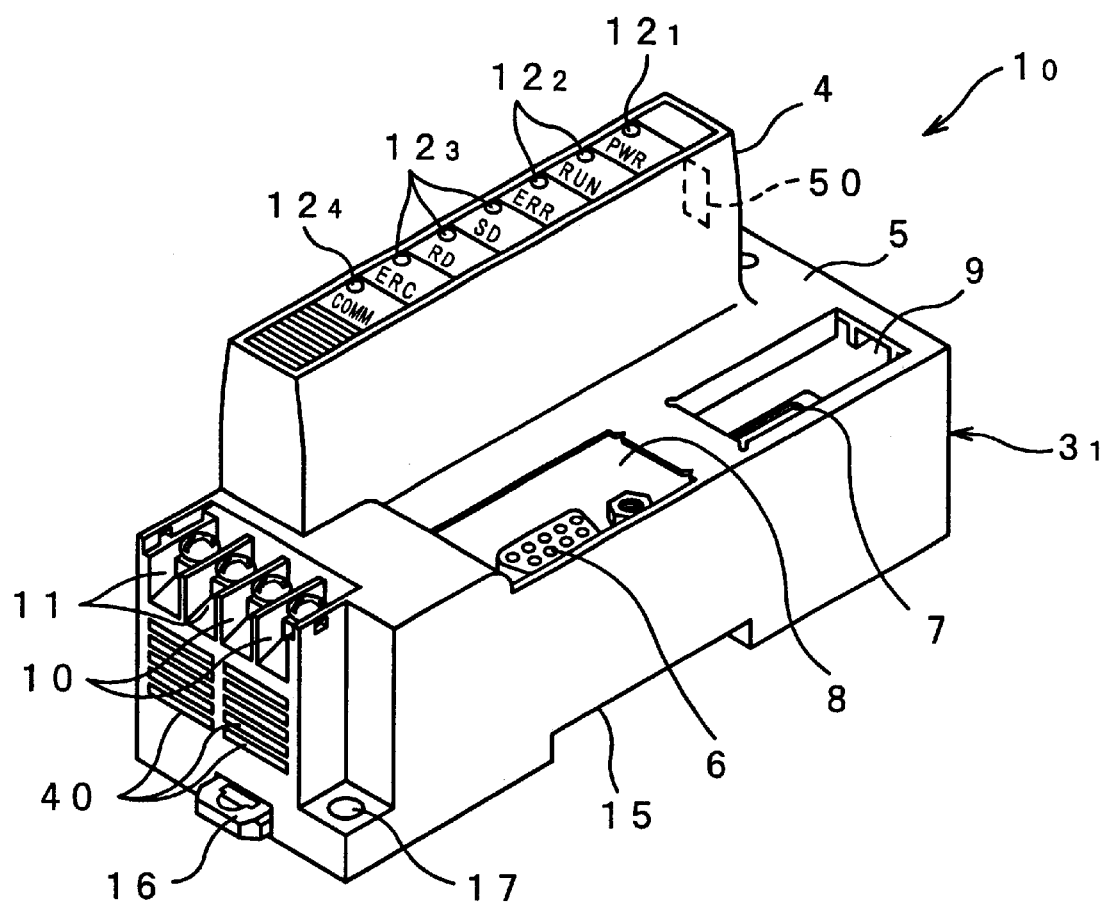
FIG. 13 is a perspective view of the programmable controller of FIG. 12.
Figure 14:
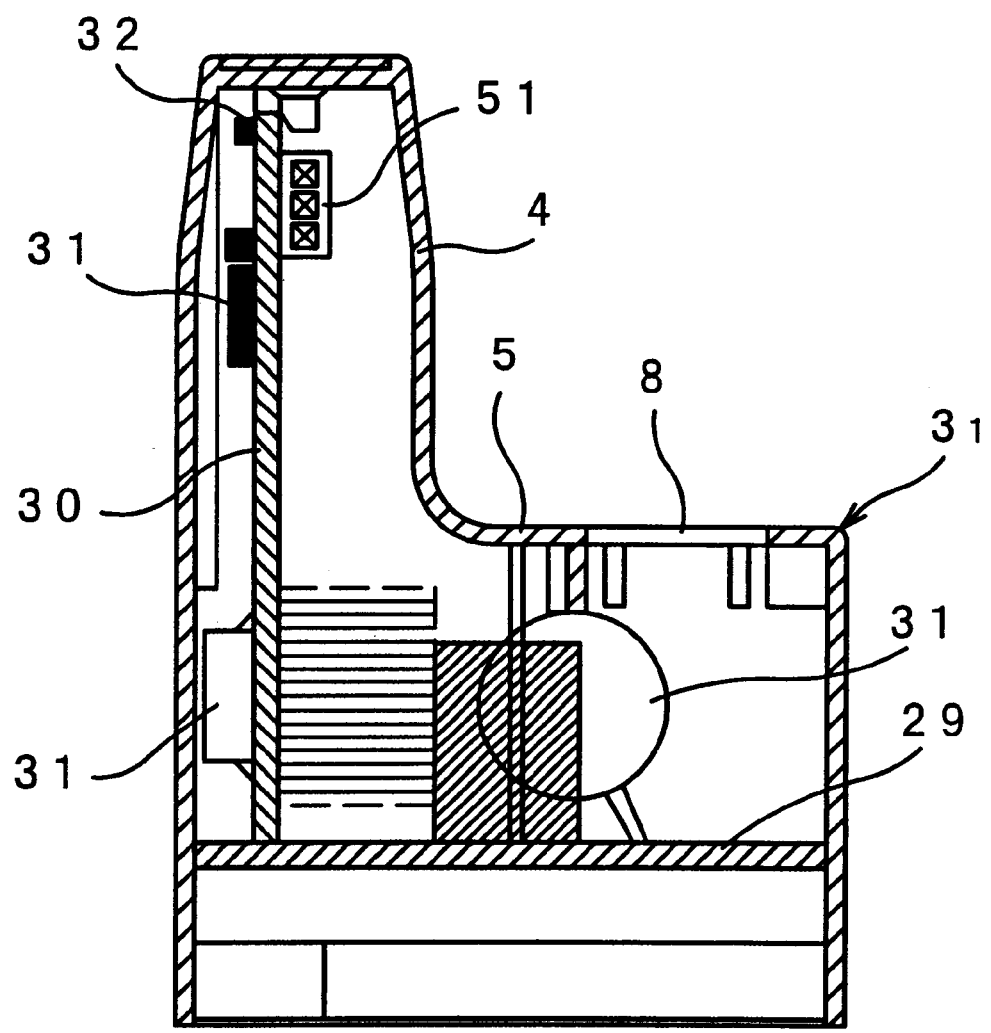
FIG. 14 is a schematic sectional view of the programmable controller to explain an internal construction thereof.

The programmable controller $1_O$ includes a connector connection unit and an interface circuit so as to communicate with distributed controllers 36 and a high speed counter 39 in addition to the serial communication function with terminals 2, an opening 50 disposed on one side of a projection 4 corresponding to a connector connection unit as shown in FIG. 13, a connector connection unit 51 disposed on a second circuit board 30 corresponding to the opening 50 as shown in FIG. 13, and a corresponding interface circuit 52 as shown in FIG. 15.

In the system of this embodiment, the programmable controller 10 transmits a set value such as a revolution speed of a stepping motor 37 to the distributed controllers 36, the controller 36 controls the revolution speed of the stepping motor 37 based on the set value so that it notifies the programmable controller $1_O$ when the revolution speed of the stepping motor 37 reaches the set value, and the programmable controller $1_O$ controls an output unit such as a valve through the terminals 2 based on such notice. Or, the high speed counter 39 measures an output of an encoder 38 to send the measured output to the programmable controller $1_O$ so that the programmable controller $1_O$ controls the output unit through the terminals 2 based on the measured output.

As another embodiment of this invention, the housing may employ a seal construction and the connector connection unit may employ a water-proof construction so that the programmable controller may be used in the circumstances wet by water and oil. The programming console RS-232C employs infrared communication to enhance its circumstance resistance.

Though the foregoing embodiments employ programmable controllers, this invention maybe applied to other control devices.

While the invention has been described and illustrated with respect to certain embodiments which give satisfactory results, it will be understood by those skilled in the art, after understanding the purpose of the invention, that various other changes and modifications may be made without departing from the spirit and scope of the invention, and it is therefore, intended in the appended claims to cover all such changes and modifications.

What is claimed is:

1. A programmable controller, comprising:
   a terminal which receives input data from an input unit and outputs output data to be applied to an output unit;
   a communication unit, coupled to the terminal, which executes a serial communication with the terminal to send the output data to the output unit and to receive the input data from the input unit; and
   a control unit which repeatedly executes an input process for reading the input data received by the communication unit, an output process for sending the output data to be transmitted by the communication unit, a program execution process for executing a user program and an other process, the program execution process being executed between the input process and a subsequent output process and the other process being executed between the output process and a subsequent input process.

2. A programmable controller according to claim 1, wherein a communication cycle of the communication unit starts with the sending of the output data by the communication unit.

3. A programmable controller according to claim 1, wherein a communication cycle of the communication unit starts with the sending of the output data by the communication unit and ends by the receipt of the input data by the communication unit following the sending.

* * * * *